United States Patent
Lim

(10) Patent No.: US 8,760,002 B2
(45) Date of Patent: Jun. 24, 2014

(54) STRUCTURE OF BATTERY DISCONNECTION UNIT FOR ELECTRIC VEHICLE

(75) Inventor: Soo-Hyun Lim, Chungcheongbuk-Do (KR)

(73) Assignee: LSIS Co., Ltd., Anyang Gyeonggi-Do (KR)

( * ) Notice: Subject to any disclaimer, the term of this patent is extended or adjusted under 35 U.S.C. 154(b) by 634 days.

(21) Appl. No.: 13/090,201

(22) Filed: Apr. 19, 2011

(65) Prior Publication Data

US 2012/0013178 A1 Jan. 19, 2012

(30) Foreign Application Priority Data

Jul. 16, 2010 (KR) .................. 10-2010-0069215

(51) Int. Cl.
*B60L 3/00* (2006.01)
(52) U.S. Cl.
USPC ............................................. 307/9.1
(58) Field of Classification Search
CPC ............. B60L 1/00; B60L 3/00; H02G 3/00
USPC .......................................... 307/9.1
See application file for complete search history.

(56) References Cited

U.S. PATENT DOCUMENTS

| | | | | |
|---|---|---|---|---|
| 3,991,356 | A * | 11/1976 | Spiteri ........................ | 320/107 |
| 7,102,480 | B2 * | 9/2006 | Bergstedt et al. ............ | 336/232 |
| 2011/0169448 | A1 * | 7/2011 | Ichikawa .................... | 320/109 |

FOREIGN PATENT DOCUMENTS

| | | |
|---|---|---|
| CN | 101461118 | 6/2009 |
| JP | 10-321109 | 12/1998 |
| JP | 2009-132357 | 6/2009 |
| JP | 2010041794 | 2/2010 |
| KR | 20020007258 | 1/2002 |
| KR | 20090132031 | 12/2009 |

OTHER PUBLICATIONS

Japan Patent Office Application Serial No. 2011-551994, Notice of Allowance dated Nov. 27, 2012, 2 pages.
The State Intellectual Property Office of the People's Republic of China Application Serial No. 201110157299.8, Office Action dated Jul. 19, 2013, 7 pages.

* cited by examiner

*Primary Examiner* — Rexford Barnie
*Assistant Examiner* — Joseph Inge
(74) *Attorney, Agent, or Firm* — Lee, Hong, Degerman, Kang & Waimey

(57) ABSTRACT

A structure of a battery disconnection unit for an electric vehicle comprises a first high voltage relay switching to a position for supplying DC power supplied from the battery to the inverter or to a position for interrupting the supply of the corresponding DC power; a second high voltage relay switching to a position for supplying DC power supplied from the charger to the battery or to a position for interrupting the supply of the corresponding DC power; a PCB including a printed wired circuit electrically connected to the second high voltage relay and providing a DC power supply path between the charger and the battery; a substrate installed to support the first and second high voltage relays; and a metal bracket supporting the PCB and the substrate and operating as a heat sink radiating heat.

6 Claims, 4 Drawing Sheets

STRUCTURE OF BATTERY DISCONNECTION UNIT FOR ELECTRIC VEHICLE

CROSS-REFERENCE TO A RELATED APPLICATION

Pursuant to 35 U.S.C. §119(a), this application claims the benefit of earlier filing date and right of priority to Korean Application 10-2010-0069215, filed on Jul. 16, 2010, the content of which is incorporated by reference herein in its entirety.

BACKGROUND OF THE DISCLOSURE

1. Field of the Invention

The present invention relates to an electric vehicle and, more particularly, to a battery disconnection unit for an electric vehicle.

2. Description of the Related Art

An electrical driving system of an electric vehicle comprises a charger 10 for rectifying an external commercial Alternating Current (abbreviated as AC hereinafter), converting it into constant Direct Current (abbreviated as DC hereinafter) electric power, and providing the same, an AC motor 40 for driving a driving shaft of a wheel of the electric vehicle, a battery 20 for charging the constant DC power from the charger 1 and supplying DC driving power, an inverter 30 for converting the DC driving power from the battery 20 into AC power that can drive the AC motor 40 and providing the same, a battery disconnection unit 50, and a heater 60 for regulating an ambient temperature of the battery 20.

The battery disconnection unit 50 is a switching circuit unit which may be switched to an electric power supplying position or to an electric power breaking position. The battery disconnection unit 50 may be switched to a position at which DC power is supplied from the charger 10 and a position at which DC power is cut off (or interrupted) between the charger 10 and the battery 20, and may be switched to a position at which DC driving power from the battery 20 or to a position at which the DC driving power is cut off between the battery 20 and the inverter 30. The battery disconnection unit 50 is a terminal portion for an input and output, which comprises a first input terminal T1 for the DC input from the charger 10, a first output terminal T2 for supplying the DC power from the charger 10 to the battery 20, a second input terminal T3 for receiving the DC driving power from the battery 20, and a second output terminal T4 for supplying the DC driving power from the battery 20 to the inverter 30.

The battery disconnection unit according to the related art will now be described. In a high voltage relay performing a power switching function, the capacity of the high voltage relay connected to the charger 10 is as small as, for example, 10 amperes (A), and the capacity of the high voltage relay connected to the inverter 30 is relatively high, which is as high as 100 amperes. In the related art, connection lines of the small capacity high voltage relay and the large capacity high voltage relay are configured as a harness such as a bus bar and/or a wire. Thus, the related art has problems in that the weight of the battery disconnection unit increases, the assembling of the battery disconnection unit are not east, and reliability of the battery disconnection unit deteriorates. In addition, the use of a semiconductor switch is required to control turning on and off the heater for regulating the temperature around the battery, causing a problem in that the bus bar and/or the wire is not suitable as a wiring for the semiconductor switch.

SUMMARY OF THE INVENTION

Therefore, in order to address the above matters, the various features described herein have been conceived.

A primary object of the present invention is to provide a structure of a battery disconnection unit for an electric vehicle capable of discriminating and simplifying lines of a small capacity high voltage relay and a large capacity high voltage relay to thus reduce the weight of a battery disconnection unit, improve the assembling characteristics and operational reliability, and effectively support a plurality of relatively heavy high voltage relays.

A secondary object of the present invention is to provide a structure of a battery disconnection unit for an electric vehicle which is suitable for a wiring of a semiconductor switch used for controlling an ON/OFF operation of a heater for regulating the temperature around a battery and is able to cool the semiconductor switch.

The primary object of the present invention can be accomplished by providing a structure of a battery disconnection unit for an electric vehicle having a battery for providing DC power, a charger for converting AC power into DC power and for charging the battery with the DC power, and an inverter for converting DC power from the battery into AC power and for providing the converted AC power to a motor, the structure comprising:

a first high voltage relay electrically connected between the battery and the inverter and switching to a position for supplying DC power supplied from the battery to the inverter or to a position for interrupting the supply of the corresponding DC power;

a second high voltage relay electrically connected between the charger and the battery and switching to a position for supplying DC power supplied from the charger to the battery or to a position for interrupting the supply of the corresponding DC power;

a printed circuit board including a printed wired circuit electrically connected to the second high voltage relay and providing a DC power supply path between the charger and the battery by having an input terminal connected to the charger and an output terminal connected to the battery;

a substrate installed at an upper portion higher than the printed circuit board to support the first and second high voltage relays; and a metal bracket that supports the printed circuit board and the substrate at a lower side and operates as a heat sink radiating heat.

The secondary object of the present invention can be accomplished by the structure of a battery disconnection unit for an electric vehicle according to the invention, wherein a metal oxide semiconductor field effect transistor (MOSEFT) for controlling an ON or OFF of a heater configured to regulate an ambient temperature of the battery is fixedly installed on a metal bracket between the metal bracket and a printed circuit board in a vertical direction in order to radiate heat through heat conduction to the metal bracket.

The foregoing and other objects, features, aspects and advantages of the present invention will become more apparent from the following detailed description of the present invention when taken in conjunction with the accompanying drawings.

DETAILED DESCRIPTION OF THE INVENTION

The foregoing and other objects, features, aspects and advantages of the present invention will become more apparent from the following detailed description of the present invention when taken in conjunction with the accompanying drawings.

Figure 1:
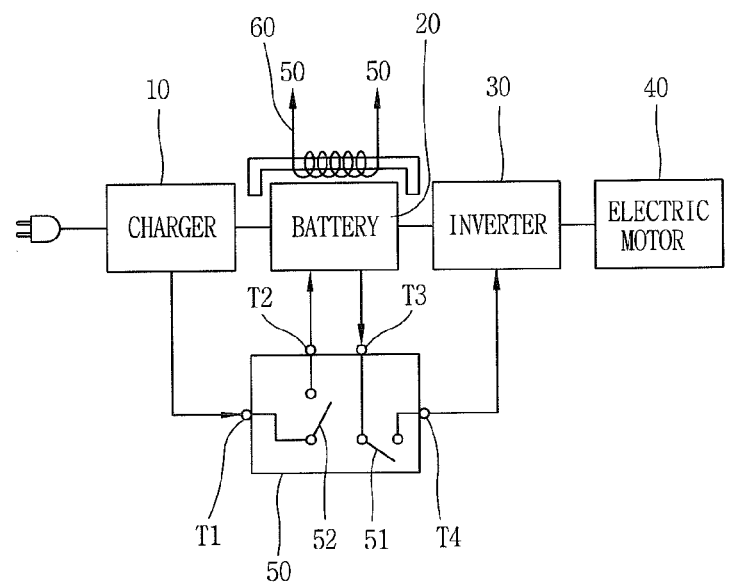
FIG. 1 is a view showing the configuration of an electric driving system of an electric vehicle.

As shown in FIG. 1, a battery disconnection unit 50 for an electric vehicle according to a preferred embodiment of the present invention is comprised in an electric driving system of an electric vehicle. The electric driving system of the electric vehicle may comprise a battery 20, a charger 10, an inverter 30, a motor 40, and a battery disconnection unit 50.

A detailed configuration and operation of the electric driving system of an electric vehicle may be referred to Korean Laid Open Publication No. 10-2009-0097080 (Title: A charging and driving apparatus for electric vehicle and charging method thereof) which was filed by the applicant of the present invention and laid open.

The charger 10 is a circuit portion for converting commercial Alternating Current electric power (abbreviated as AC power hereinafter) into DC power to charge the battery 20, which may be configured as a circuit comprising a diode rectifying circuit, a semiconductor switch such as thyristor, and a capacitor. A detailed configuration and operation of the charger 10 will be omitted there because they can be referred to the publication.

The battery 20 may be configured as a high voltage battery providing high voltage DC power that can rotatably drive the electric vehicle, namely, the motor 40. The battery 20 is a rechargeable DC power source called a battery pack. The battery 20 may be selectively configured as a lead battery, a nickel-cadmium battery, a lithium-ion battery, and the like, which are well known to be used for an electric vehicle.

The inverter 30 is an electric power conversion unit for converting DC power supplied from the battery 20 into AC power and providing the same to the motor 40. A detailed configuration and operation of the inverter will be omitted there because they are will known and can be referred to the publication.

The motor 40 may be configured as a three-phases induction motor.

As can be understood from FIG. 1, the battery disconnection unit 50 for an electric vehicle according to a preferred embodiment of the present invention may be connected to a heater 60 for controlling an ambient temperature of the battery 20 in order to control an ON or OFF of the heater 60.

As shown in FIG. 1, the battery disconnection unit 50 for an electric vehicle according to a preferred embodiment of the present invention comprises a first input terminal T1 connected to the charger 10 and a first output terminal T2 connected to the battery 20, and a second input terminal T3 connected to the battery 20 and a second output terminal T4 connected to the inverter 30. Also, the battery disconnection unit 50 for an electric vehicle according to a preferred embodiment of the present invention comprises a first high voltage relay 51 and a second high voltage relay 52. The first high voltage relay 51 is electrically connected between the battery 20 and the inverter 30, which is a switching unit that can be switched to a position for supplying DC power supplied from the battery 20 to the inverter 30 or to a position for breaking the supply of the corresponding DC power supplied from the battery 20 to the inverter 30. The second high voltage relay 52 is electrically connected between the charger 10 and the battery 20, which is a switching unit that can be switched to a position for supplying DC power supplied from the charger 10 to the battery 20 or to a position for breaking the supply of the corresponding DC power.

The configuration and operation of the battery disconnection unit 50 for an electric vehicle according to a preferred embodiment of the present invention will now be described in detail with reference to FIGS. 2 to 8.

Figure 2:
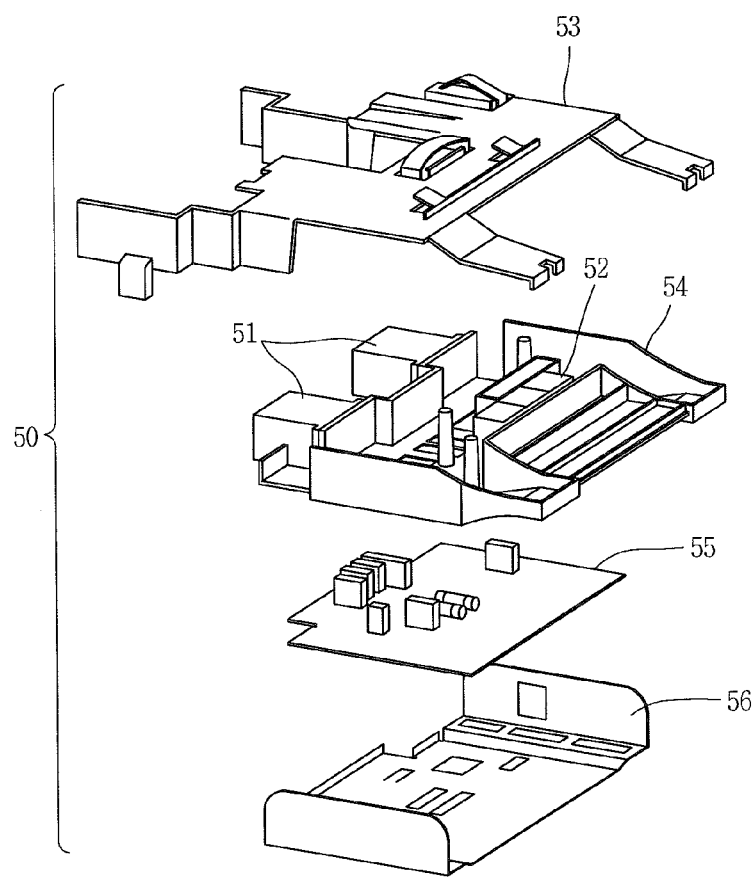
FIG. 2 is an exploded perspective view showing a battery disconnection unit for an electric vehicle according to a preferred embodiment of the present invention.

As can be understood from FIG. 2, the battery disconnection unit 50 for an electric vehicle according to a preferred embodiment of the present invention is configured to comprise a printed circuit board 55, a substrate 54, and a metal bracket 56.

The battery disconnection unit 50 for an electric vehicle according to a preferred embodiment of the present invention may further comprise a cover 53 for covering an upper portion of the substrate 54. The cover 53 may be provided as a means for protecting the battery disconnection unit 50 for an electric vehicle according to a preferred embodiment of the present invention against an impact or a contact applied from an outer upper portion.

As can be understood from FIG. 2, the first high voltage relay 51 and the second high voltage relay 52 are installed on the substrate 54 and supported by the substrate 54.

The printed circuit board (abbreviates as PCB hereinafter) 55 comprises a printed wiring circuit electrically connected to the second high voltage relay 52, and as can be understood from FIG. 1, the PCB 55 comprises the first input terminal T1 connected to the charger 10 and the first output terminal T2 connected to the battery 20 to provide a DC power supply path between the charger 10 and the battery 20. As well known, the PCB 55 comprises a circuit pattern of a copper thin film formed on a substrate made of an artificial resin material called Reinforced Fiber Glass Plastic or plastic. As can be understood from FIG. 3, the PCB 55 comprises a fork shape connection terminal 55a to be electrically connected to the second high voltage relay 52.

The substrate 54 is installed on an upper position than the PCB 55 such that it supports the first high voltage relay 51 and the second high voltage relay 52. The substrate 54 is made of an artificial resin material called plastic and may be configured as a plate which has a thickness ranging from 2 mm to 4 mm, has excellent mechanical strength, and is suitable for a mass production by a mold. The first high voltage relay 51 and the second high voltage relay 52 have a weight of 400 grams and 80 grams, respectively, so a general PCB is not suitable for supporting the first high voltage relay 51 and the second high voltage relay 52. Thus, the inventor of the present application has devised a configuration of the substrate 54 which is able to sufficiently support the weighty first high voltage relay 51 and the second high voltage relay 52. The battery disconnection unit 50 for an electric vehicle according to a preferred embodiment of the present invention is configured such that the first high voltage relay 51 and the second high voltage relay 52 are supported by the plastic substrate 54 having a thickness of, for example, approximately 4 mm installed on the PCB 55. Thus, the first high voltage relay 51 and the second high voltage relay 52 each having a considerable weight of 400 grams an 80 grams can be stably supported by the supporting substrate 54, rather than by the PCB 55. As can be understood from FIGS. 7 and 8, the substrate 54 comprises a plurality of support wall portions 54a and a plurality of opening portions 54b.

Figure 7:
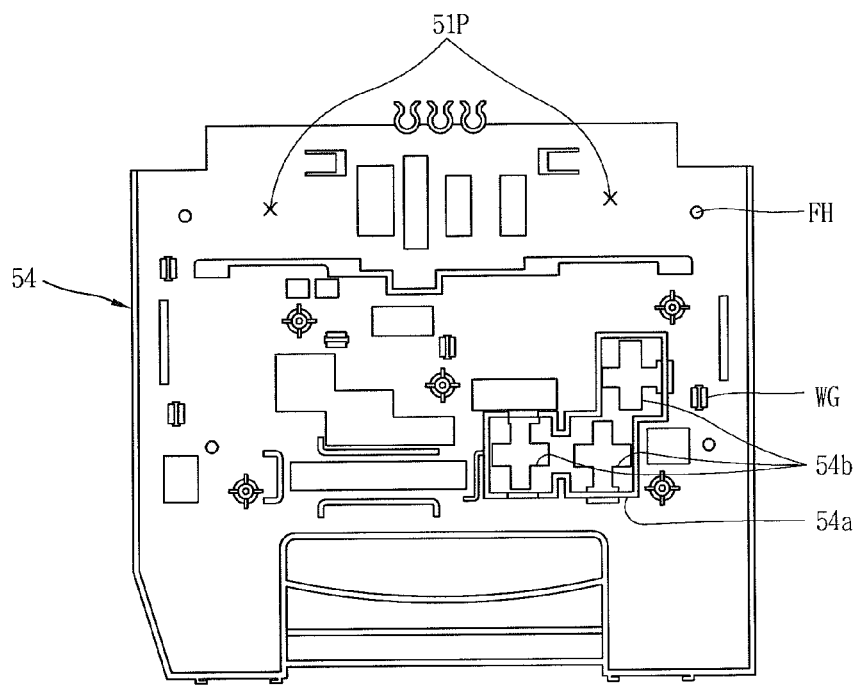
FIG. 7 is a plan view showing the configuration of a substrate of the battery disconnection unit for an electric vehicle according to a preferred embodiment of the present invention.
Figure 8:
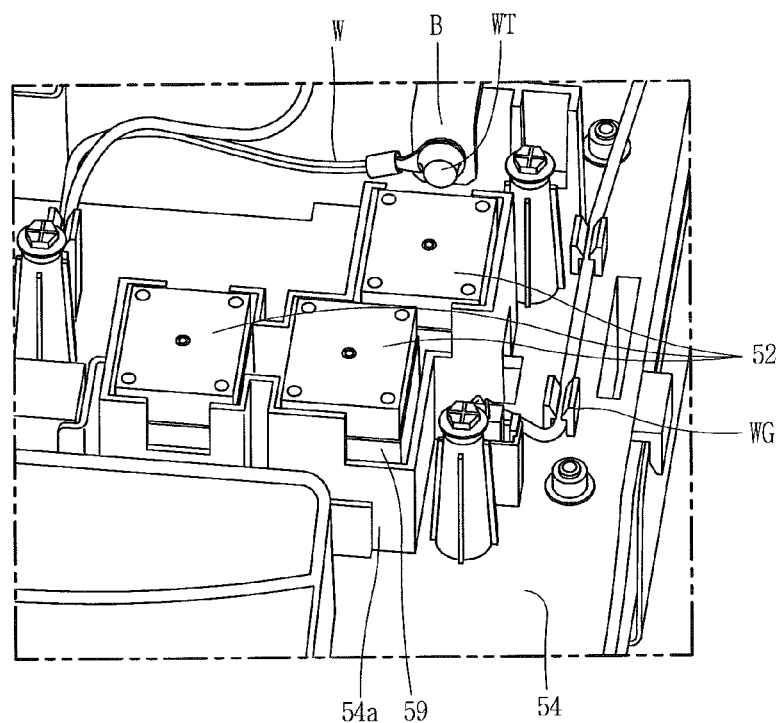
FIG. 8 is a partial enlarged perspective view showing a portion of the substrate supporting the second high voltage relay of the battery disconnection unit for an electric vehicle according to a preferred embodiment of the present invention.

In FIGS. 7 and 8, a plurality of quadrangular support wall portions 54a (in the present exemplary embodiment, three quadrangular support wall portions 54a) are formed to correspond to the shape of the second high voltage relay 52 and formed to upwardly extend from the bottom surface of the substrate 54 to allow the second high voltage relay 52 to be supportedly inserted therein. As can be understood from FIGS. 4 and 8, in the present exemplary embodiment of the present invention, the support wall portions 54a is formed to have a substantially same height as that of a wide upper portion of the second high voltage relay 52.

In order to electrically connect the second high voltage relay 52 to the PCB 55, as can be understood from FIG. 7, the plurality of opening portions 54b are provided in the respective support wall portions 54a of the substrate 54, allowing the second high voltage relay 52 to partially pass therethrough. Here, the allowing of the partial passage of the second high voltage relay 52 may mean that only a lower portion 52b of the second high voltage relay 52 having a narrow width is allowed to pass therethrough. A band shape isolating member 59 made of a rubber material (to be described) is inserted into a lower portion of the upper portion of the second high voltage relay 52 having a large width in a surrounding manner.

In FIGS. 7 and 8, a reference character WG designates a pair of support projections, which are conducting wire guiding support portions allowing a conducting wire (in other words cable) (W) connected to the first high voltage relay 51 to be supportedly inserted therein, formed to be upwardly protruded from the surface of the substrate 54 and formed to guide and support with the conducting wire (W) inserted therebetween as can be understood from FIG. 8. In FIG. 7, in the present exemplary embodiment, a reference character FH designates a screw hole in which a nut member, which is threaded with a connection screw (not shown) extending through the PCB 55 from the metal bracket 56, is to be mounted therein. In FIG. 7, reference numeral 51P designates a position on the substrate 54 where two first high voltage relays 51 are to be installed.

The metal bracket 56 supports the PCB 55 and the substrate 54 from the lower side, and operates as a heat sink for releasing heat. The metal bracket 56 may be made of aluminum according to a preferred embodiment of the present invention. The metal bracket 56 may be configured to have a substantially U shape formed by bending both end portions in a lengthwise direction or a box-like shape with an upper side open, so as to be suitably receive the PCB 55 and the substrate 54 at an upper side thereof. The metal bracket 56 may have a plurality of opening portions allowing an external conducting wire to pass therethrough and a plurality of screw holes for fixing to an electric vehicle.

As can be understood from FIG. 1, the first high voltage relay 51 is electrically connected between the battery 20 and the inverter 30. Namely, the first high voltage relay 51 is a switching unit that can be switched to a position for supplying DC power supplied from the battery 20 to the inverter 30 or a position for interrupting the supply of the corresponding DC power. The first high voltage relay 51 may be configured to comprise a coil magnetized according to an application of an electrical signal and a contact which is open or closed when the coil is magnetized. The first high voltage relay 51 is a switch that supplies power from the battery 20 of a high voltage and large capacity to the inverter 30, so the first high voltage relay 51 has a larger current capacity, and is heavier by five times than the second high voltage relay 52. Here, in the present exemplary embodiment, the current capacity of the first high voltage relay is 100 amperes, which is ten times the current capacity of the second high voltage relay 52 whose current capacity is 10 amperes. As mentioned above, the weight of the first high voltage relay 51 is 400 grams, five times that of the second high voltage relay 52 whose weight is 80 grams. Thus, as can be understood from FIG. 8, the wiring of the first high voltage relay 51 is electrically connected to the battery 20 and the inverter 30 through the conducting wire (W) and a bus bar (B). In FIG. 8, reference character WT designates a terminal installed at an end portion of the conducting wire (W) in order to electrically and mechanically connect the conducting wire (W) to the bus bar (B).

The second high voltage relay 52 is electrically connected between the charger 10 and the battery 20, which is a switching unit that can be switched to a position for supplying DC power supplied from the charger 10 to the battery 20 or to a position for interrupting the supply of the corresponding DC power. The second high voltage relay 52 may be configured to comprise a coil magnetized according to an application of an electrical signal and a contact which is open or closed when the coil is magnetized. The second high voltage relay 52 is a switch installed at a circuit for supplying DC power from the charger 10 having a small electric capacity to the battery 20, so as mentioned above, the second high voltage relay 52 may be configured as a relay having a smaller capacity and smaller weight than those of the first high voltage relay 51.

The switching of the opening and closing of the first high voltage relay 51 and the second high voltage relay 52 may be controlled by a switching control signal from a vehicle control unit (not shown). A detailed description of the corresponding vehicle control unit can be referred to Korean Laid Open Publication No. 10-2009-0097030, and because the vehicle control unit is not directly related to the present invention, a description thereof will be omitted.

Figure 3:
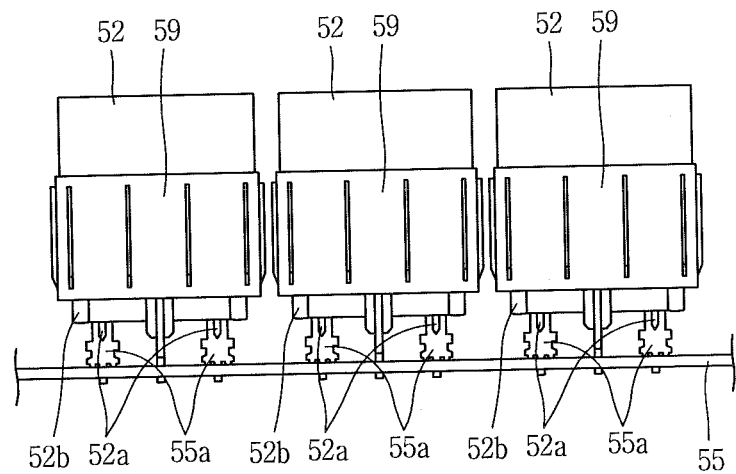
FIG. 3 is a side view showing a connection configuration of a second high voltage relay and a printed circuit board of the battery disconnection unit for an electric vehicle according to a preferred embodiment of the present invention.

As can be understood from FIG. 3, the second high voltage relay 52 comprises the terminal 52a, and the PCB 55 comprises the fork shape connection terminal 55a configured as an electric conductor in order to allow the terminal 52a of the second high voltage relay 52 to be inserted and mechanically and electrically connected.

In FIG. 3, the second high voltage relay 52 is elastically supported by the band shape isolating member 59 made of a rubber material surrounding the body portion. The battery disconnection unit for an electric vehicle according to a preferred embodiment of the present invention is configured such that the second high voltage relay 52 is surrounded by the band shape isolating member 59 made of a rubber material to elastically support it. Thus, the second high voltage relay 52 can be prevented from being vibrated or wobbled, and thus, generation of noise due to a contact between the second high voltage relay 52 and the ambient substrate 54 can be prevented. Also, because the isolating member 59 made of a rubber material has electrical insulation, the second high voltage relay 52 and the ambient substrate 54 can be further electrically insulated.

Figure 4:
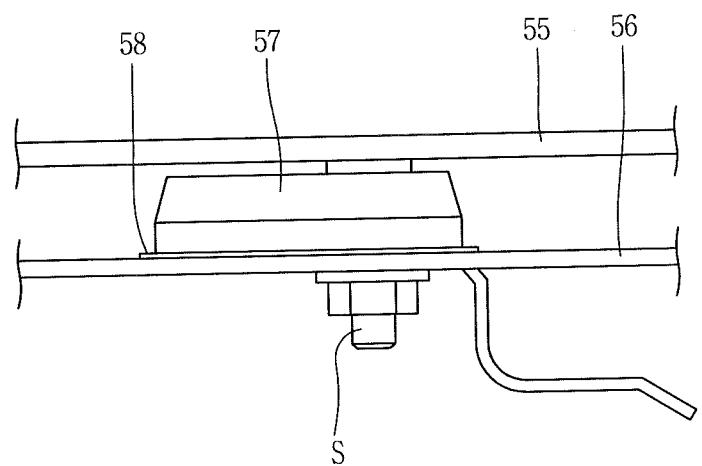
FIG. 4 is a partial vertical sectional view showing a support structure of the second high voltage relay of the battery disconnection unit for an electric vehicle according to a preferred embodiment of the present invention.
Figure 5:
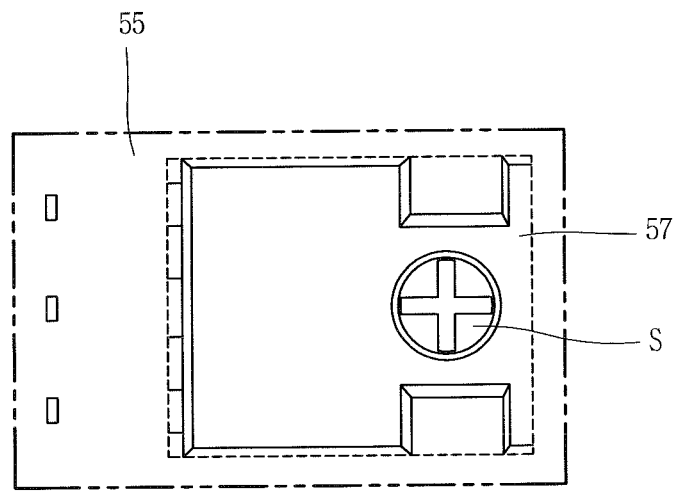
FIG. 5 is a partial plan view showing a connection structure of the printed circuit board and a metal oxide semiconductor field effect transistor (MOSFET) of the battery disconnection unit for an electric vehicle according to a preferred embodiment of the present invention.
Figure 6:
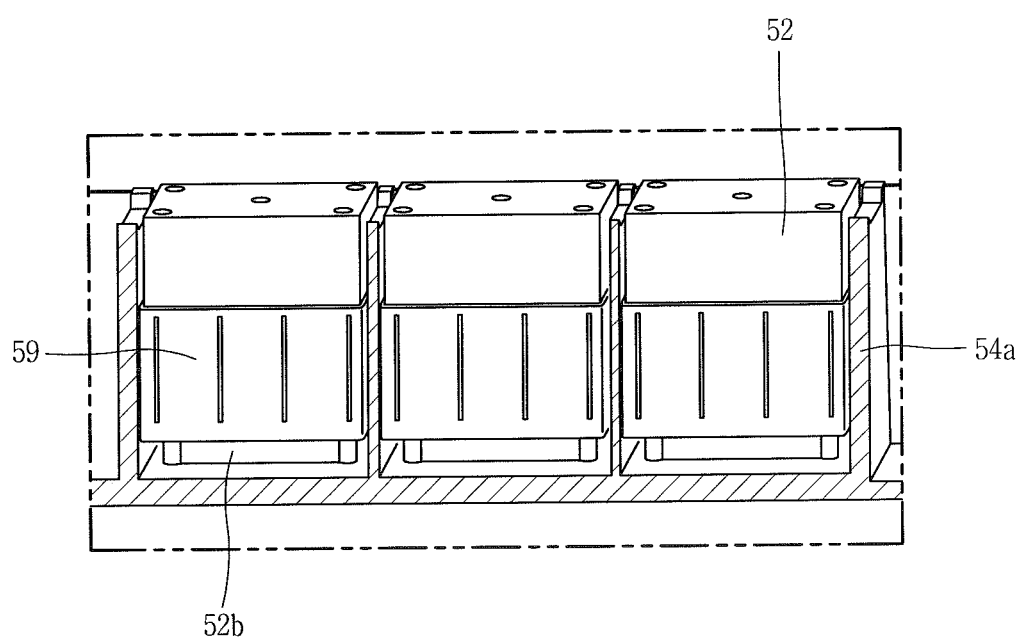
FIG. 6 is a partial side view showing the structure of the printed circuit board, the MOSFET, a cooling fiber sheet, and a metal bracket of the battery disconnection unit for an electric vehicle according to a preferred embodiment of the present invention.

As for the heater 60 for adjusting ambient temperature of the battery 20 as described above with reference to FIG. 1, the battery disconnection unit 50 for an electric vehicle according to a preferred embodiment of the present invention may further comprise a metal oxide semiconductor field effect transistor (MOSFET) 57 a shown in FIGS. 5 and 6 in order to control an ON or OFF operation of the heater 60. As can be understood from FIGS. 4 and 5, the MOSFET 57 is fixedly installed on the metal bracket 56 by a fixing screw (S) such that it is positioned between the metal bracket 56 and the PCB 55 in a vertical direction. As discussed above, the MOSFET 57 is a semiconductor switch element for controlling an ON or OFF operation of the heater 60 to adjust the ambient temperature of the battery 20. Thus, the MOSFET 57 is connected to the PCB 55 through a signal path (not shown), and in order to output an ON/OFF control signal, the MOSFET 57 is connected to the heater 60 through a signal path (not shown).

Also, as can be understood from FIG. 4, the battery disconnection unit 50 for an electric vehicle according to a preferred embodiment of the present invention may be configured to further comprise a cooling fiber sheet 58 having an electric insulation and heat conductivity and insertedly installed between the MOSFET 57 and the metal bracket 56 in order to more effectively radiate heat of the MOSFET 57. The cooling fiber sheet 58 may be configured as a thin fiber sheet made of fiber called "Nomax", a registered trademark of Dupont Corp., as an aramid group aromatic series polyamide fiber. The Nomax fiber has excellent electric insulation and heat conductivity, and, in addition, the Nomax fiber has excellent heat resistance, flame retardancy, strength, and durability.

A process of assembling the battery disconnection unit 50 for an electric vehicle according to a preferred embodiment of the present invention will now be described.

As can be understood from FIG. 2, briefly, the battery disconnection unit 50 for an electric vehicle according to a preferred embodiment of the present invention is assembled such that the metal bracket 56, the lowermost portion, is fixed at an installation position of an electric vehicle, the PCB 55 is disposed on an upper surface of the metal bracket 56, the substrate 54 is installed on an upper surface of the PCB 55, and the cover 53 is then installed at an upper portion of the substrate 54.

In the installation, the positions of the metal bracket 56, the lowermost portion, and the PCB 55 may be fixed by fixing screws and nuts (not shown).

In installing the cover 53 and the substrate 54, a hinge portion prepared at a right end portion of the cover 53 in FIG. 2 is inserted into a corresponding hinge recess prepared at a right end portion of the substrate 54, and the opposite side of the cover 53 is then moved to cover downwardly.

Here, the assembling of the second high voltage relay 52 will now be described in detail. In the substrate 54 of FIG. 7, a lower portion 52b of the three second high voltage relays 52 are inserted through the opening portions 54b as shown in FIG. 3, and the terminal 52a provided at a lower end portion of the second high voltage relays 52 is inserted into the fork shape connection terminal 55a provided to correspond to the PCB 55 to thereby mechanically and electrically connect the second high voltage relays 52 and the PCB 55.

The assembling of the MOSFET 57 will now be described in detail. As can be understood from FIG. 4, the MOSFET 57 is fixedly installed on the metal bracket 56 by using a fixing screw (S) such that it is positioned between the metal bracket 56 and the PCB 55 in a vertical direction. Next, in order to receive an ON/OFF control signal, the MOSFET 57 is connected to the PCB 55 through a signal path (not shown), and in order to output an ON/OFF control signal outputted from the MOSFET 57 to the heater (60 in FIG. 1), the MOSFET 67 is connected to the heater 60 through a signal path (not shown).

In a preferred embodiment of the present invention, in order to more effectively radiate heat from the MOSFET 57, the cooling fiber sheet 58 having excellent electric insulation and heat conductivity is installed between the MOSFET 57 and the metal bracket 56.

Meanwhile, the operation of the battery disconnection unit 50 for an electric vehicle according to a preferred embodiment of the present invention which is configured and assembled as described will now be described briefly with reference to FIG. 1.

Commercial AC power through a plug is converted into DC power through the charger 10 and supplied to the battery 20 through the second high voltage relay 52 of the battery disconnection unit 50 to charge the battery 20. In this case, ON position switching of the second high voltage relay 52 can be performed by a control signal from a vehicle control device (not shown).

In a state in which DC power sufficient for driving the vehicle is charged in the battery 20, the first high voltage relay 51 of the battery disconnection unit 50 according to a control signal from the vehicle control device (not shown) is switched to an ON position to supply DC power from the battery 20 to the inverter 30.

The inverter 30 converts the DC power from the battery 20 into AC power and drives the motor 40, an AC motor, in order to drive the vehicle.

As described above, in the battery disconnection unit 50 for an electric vehicle according to a preferred embodiment of the present invention, because the second high voltage relay 52, the charger 10, and the battery 20 are connected by the PCB 55 as a circuit path, rather than through a bus bar and a conducting wire, the weight of the battery disconnection unit 50 can be reduced and the wiring assembly can be simplified, compared with the case in which they are connected through a bus bar and a conducting wire, and accordingly, because the wiring connection configuration is simplified, an erroneous assembling can be prevented to thus improve operation reliability.

Also, in the battery disconnection unit 50 for an electric vehicle according to a preferred embodiment of the present invention, the first high voltage relay 51 and the second high voltage relay 52 are supported by the plastic substrate 54 having a thickness of about 4 millimeters and installed at an upper portion of the PCB 55, the first high voltage relay 51 and the second high voltage relay 52, each having a weight of approximately 400 grams and 80 grams, can be stably supported by the supporting substrate, namely, the substrate 54, rather than the PCB 55.

Also, in the battery disconnection unit 50 for an electric vehicle according to a preferred embodiment of the present invention, because the metal bracket 56 which operates as a heat sink for releasing heat as well as supports the PCB 55 and the substrate 54 are supported together at the lower portion is comprised, the overall weight of the battery disconnection unit 50 can be stably supported and the heat releasing portion can be provided to the battery disconnection unit 50.

Also, in the battery disconnection unit 50 for an electric vehicle according to a preferred embodiment of the present invention, because the MOSFET 57 as a semiconductor switching element for controlling an ON or OFF operation of the heater 60 for adjusting an ambient temperature of the battery 20 is installed between the metal bracket 56 and the PCB 55, heat generated from the MOSFET 57 can be easily radiated through the metal bracket 56 to thereby preventing the MOSFET 57 from being damaged due to overheat.

Also, in the battery disconnection unit 50 for an electric vehicle according to a preferred embodiment of the present invention, because the cooling fiber sheet 58 having electrical insulation and heat conductivity is further comprised between the MOSFET 57 and the metal bracket 56, heat generated from the MOSFET 57 can be more effectively conducted to the metal bracket 56, thus perform heat releasing.

Also, in the battery disconnection unit 50 for an electric vehicle according to a preferred embodiment of the present invention, because the second high voltage relay 52 comprises the terminal 52a and the PCB 55 comprises the fork shape connection terminal 55a formed as an electric conductor to allow the corresponding terminal 52a to be inserted to be connected, the second high voltage relay 52 can be connected to the PCB 55 by simply inserting the terminal 52a of the second high voltage relay 52 to the fork shape connection terminal 55a of the PCB 55. Thus, assembling and dissembling can be simplified to improve the productivity of the battery disconnection unit for an electric vehicle.

Also, in the battery disconnection unit 50 for an electric vehicle according to a preferred embodiment of the present invention, because the band shape isolating member 59 made of a rubber material surrounds the second high voltage relays to elastically support them, the second high voltage relays 52 can be prevented from being vibrated or wobbled, and thus, generation of a noise of the second high voltage relay 52 and the substrate 54, in particular, noise due to a contact between the substrate 54 and the supporting wall portion 54a can be prevented.

Also, in the battery disconnection unit 50 for an electric vehicle according to a preferred embodiment of the present invention, because the cover 53 is further comprised to cover the upper portion of the substrate 54, the battery disconnection unit 50 can be stably protected against an external foreign material or access.

Also, in the battery disconnection unit 50 for an electric vehicle according to a preferred embodiment of the present invention, because the substrate 54 comprises the plurality of supporting wall portions 54a formed to correspond to the shape of the second high voltage relay 52 and formed to upwardly extend from the bottom surface of the substrate 54 to allow the second high voltage relay 52 to be insertedly supported thereby. Correspondingly, in order to electrically connect the second high voltage relay 52, the substrate 54 comprises the plurality of opening portions 54b formed in the respective supporting wall portions 54a and allowing the second high voltage relay 52 to partially pass therethrough. Thus, the second high voltage relay 52 can be stably supported by the substrate 54 and the second high voltage relay 52 can be directly connected to the PCB 55 at a lower side of the substrate 54, without the necessity of a connection wire. Also, the second high voltage relay 52 can be stably supported and its electrical connection configuration with the PCB 55 can be simplified.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A battery disconnection unit for an electric vehicle, the electric vehicle having a battery for providing DC power, a charger for converting AC power into DC power and for charging the battery with the DC power, and an inverter for converting DC power from the battery into AC power and for providing the converted AC power to a motor, the battery disconnection unit comprising:

a first high voltage relay electrically connected between the battery and the inverter, the first high voltage relay switching to either a position for supplying DC power from the battery to the inverter or to a position for interrupting the supply DC power from the battery;

a second high voltage relay electrically connected between the charger and the battery, the second high voltage relay switching to either a position for supplying DC power from the charger to the battery or to a position for interrupting the supply of DC power from the charger;

a printed circuit board including a printed wired circuit electrically connected to the second high voltage relay and providing a DC power supply path between the charger and the battery via an input terminal connected to the charger and an output terminal connected to the battery;

a substrate installed at a position higher than the printed circuit board, the substrate supporting the first and second high voltage relays;

a metal bracket supporting a lower side of the printed circuit board and substrate and providing a heat sink for radiating heat;

a heater controlling an ambient temperature of the battery; and a metal oxide semiconductor field effect transistor fixedly installed on the metal bracket, the field effect transistor controlling the heater to turn on or off in order to radiate heat to the metal bracket through heat conduction.

2. The structure of claim 1, further comprising:

a cooling fiber sheet installed between the metal oxide semiconductor field effect transistor and the metal bracket, the cooling fiber sheet providing electrical insulation and heat conduction.

3. The structure of claim 1, further comprising:

a cover covering an upper portion of the substrate.

4. A battery disconnection unit for an electric vehicle, the electric vehicle having a battery for providing DC power, a charger for converting AC power into DC power and for charging the battery with the DC power, and an inverter for converting DC power from the battery into AC power and for providing the converted AC power to a motor, the battery disconnection unit comprising:

a first high voltage relay electrically connected between the battery and the inverter, the first high voltage relay switching to either a position for supplying DC power from the battery to the inverter or to a position for interrupting the supply DC power from the battery;

a second high voltage relay electrically connected between the charger and the battery, the second high voltage relay including a terminal and switching to either a position for supplying DC power from the charger to the battery or to a position for interrupting the supply of DC power from the charger;

a printed circuit board including a printed wired circuit electrically connected to the second high voltage relay via a fork shaped connection terminal that is configured as an electrical conductor to allow the terminal of the second high voltage relay to be inserted therein, the printed circuit board providing a DC power supply path between the charger and the battery via an input terminal connected to the charger and an output terminal connected to the battery;

a substrate installed at a position higher than the printed circuit board, the substrate supporting the first and second high voltage relays; and a metal bracket supporting a lower side of the printed circuit board and substrate and providing a heat sink for radiating heat.

5. A battery disconnection unit for an electric vehicle, the electric vehicle having a battery for providing DC power, a charger for converting AC power into DC power and for charging the battery with the DC power, and an inverter for converting DC power from the battery into AC power and for providing the converted AC power to a motor, the battery disconnection unit comprising:

a first high voltage relay electrically connected between the battery and the inverter, the first high voltage relay switching to either a position for supplying DC power from the battery to the inverter or to a position for interrupting the supply DC power from the battery;

a second high voltage relay electrically connected between the charger and the battery, the second high voltage relay switching to either a position for supplying DC power from the charger to the battery or to a position for interrupting the supply of DC power from the charger;

a printed circuit board including a printed wired circuit electrically connected to the second high voltage relay and providing a DC power supply path between the charger and the battery via an input terminal connected to the charger and an output terminal connected to the battery;

a substrate installed at a position higher than the printed circuit board, the substrate supporting the first and second high voltage relays;

a metal bracket supporting a lower side of the printed circuit board and substrate and providing a heat sink for radiating heat; and a band shaped rubber isolating member surrounding and elastically supporting the second high voltage relay.

6. A battery disconnection unit for an electric vehicle, the electric vehicle having a battery for providing DC power, a charger for converting AC power into DC power and for charging the battery with the DC power, and an inverter for converting DC power from the battery into AC power and for providing the converted AC power to a motor, the battery disconnection unit comprising:

a first high voltage relay electrically connected between the battery and the inverter, the first high voltage relay switching to either a position for supplying DC power from the battery to the inverter or to a position for interrupting the supply DC power from the battery;

a second high voltage relay electrically connected between the charger and the battery, the second high voltage relay switching to either a position for supplying DC power from the charger to the battery or to a position for interrupting the supply of DC power from the charger;

a printed circuit board including a printed wired circuit electrically connected to the second high voltage relay and providing a DC power supply path between the charger and the battery via an input terminal connected to the charger and an output terminal connected to the battery;

a substrate installed at a position higher than the printed circuit board, the substrate supporting the first and second high voltage relays; and a metal bracket supporting a lower side of the printed circuit board and substrate and providing a heat sink for radiating heat, wherein the substrate includes:

a plurality of support wall portions formed to correspond to a shape of the second high voltage relay and extending upward from a bottom surface of the substrate to allow insertion of the second high voltage relay therein; and a plurality of opening portions provided on each of the support wall portions, the plurality of opening portions allowing the second high voltage relay to partially pass therethrough in order to electrically connect the second high voltage relay to the printed circuit board.

* * * * *